United States Patent [19]

Obata et al.

[11] Patent Number: 4,758,925
[45] Date of Patent: Jul. 19, 1988

[54] HOUSING FOR ELECTRONIC EQUIPMENT CONNECTABLE WITH ANOTHER HOUSING OF LIKE CONSTRUCTION ADJACENT THERETO

[75] Inventors: Yoshiaki Obata; Akimitsu Ohmori, both of Tokyo, Japan

[73] Assignee: Kabushiki Kaisha Toshiba, Kawasaki, Japan

[21] Appl. No.: 833,596

[22] Filed: Feb. 27, 1986

[30] Foreign Application Priority Data

Feb. 28, 1985 [JP] Japan .................................. 60-37447

[51] Int. Cl.$^4$ ............................................. H05K 7/20
[52] U.S. Cl. .................................... 361/384; 361/383
[58] Field of Search ...................... 165/122; 174/16 R; 361/383–384, 429, 427

[56] References Cited

U.S. PATENT DOCUMENTS

| 2,412,989 | 12/1946 | Kotterman | 361/384 |
| 3,926,250 | 12/1975 | Engwall | 165/122 |
| 4,500,944 | 2/1985 | Roberts et al. | 361/384 |

FOREIGN PATENT DOCUMENTS 2436516  5/1980  France ................................ 361/429

Primary Examiner—A. D. Pellinen
Assistant Examiner—Gregory D. Thompson
Attorney, Agent, or Firm—Finnegan, Henderson, Farabow, Garrett and Dunner

[57] ABSTRACT

A housing unit for containing electronic equipment consists of a plurality of housings which are connectable one to another. Each independent housing has respective first intake and exhaust ports formed in opposite sidewalls as well as respective second intake and exhaust ports formed in the front and rear walls respectively. An air flow passage is formed between the first intake and first exhaust ports through the chassis of the equipment contained in the housing when one housing is used as a stand alone unit. The individual housings are so constructed to be connectable in a way that air flow passages are conveniently formed in each housing with a common partition wall between the passages.

9 Claims, 5 Drawing Sheets

HOUSING FOR ELECTRONIC EQUIPMENT CONNECTABLE WITH ANOTHER HOUSING OF LIKE CONSTRUCTION ADJACENT THERETO

BACKGROUND OF THE INVENTION

1. Field of the Invention

The present invention relates to an assembly of housings containing communication equipment or other electronic equipment and connectable with each other.

2. Description of the Prior Art

In general, housings containing communication equipment or other electronic equipment are provided with cooling fans for discharging hot air from the housing to remove the heat generated from the equipment, and to introduce outside air into the housing.

In many cases, the housings are arranged adjacent to one another, so that it is impossible to exhaust hot air from the side faces of each housing. Conventionally, therefore, the housings have intake ports and exhaust ports in the front and rear faces, respectively.

The prior art housings are constructed as shown in FIG. 1, for example. In FIG. 1, two such housings are connected to each other. Each housing comprises frames 1, front wall 8, rear wall 9, and side walls 10 (one of which is removed in FIG. 1). It contains therein chassis 4 which is mounted with electronic equipment. The chassis 4 is provided with cooling fan unit 11, and is supported in position inside the housing by support plates 3. Front and rear walls 8 and 9 are formed with intake ports 8a and exhaust ports 9a, respectively. Partition wall 6 is disposed in the housing, whereby the inside of the housing is divided into intake-side and exhaust-side passages 13 and 14. Intake-side passage 13 connects with ports 8a and one end of chassis 4, and exhaust-side passage 14 with ports 9a and the other end of chassis 4. Ventilating fan 12 is provided near exhaust ports 9a.

When connecting a plurality of such housings, the facing side walls of the adjoining housings are removed, adjacent frames 1 are coupled together by means of bolts and nuts which are schematically shown by a short line 2, and partition wall 7 is mounted on frames 1, as shown in FIG. 1. In this housing unit, air flows along paths indicated by arrows A to cool the electronic equipment in chassis 4. At the same time, the unit is ventilated.

In these prior art housings, passages 13 and 14 are necessarily formed on both sides of chassis 4. Therefore, the housings have a substantial width, requiring a wide setting floor area. Recently, in particular, the electronic equipment contained in the housings has increased its density of integration to produce more heat. Therefore, the flow rate of cooling air must be increased to cool the equipment. Thus, intake and exhaust-side passages 13 and 14 must inevitably be widened, thus further increasing the width of the housings.

SUMMARY OF THE INVENTION

An object of the present invention is to reduce the width of an assembly of housings which contain electronic equipment therein, and which are adapted to be connected with each other.

Another object of the invention is to provide common exhaust passages with a wide cross-sectional area for cooling air in a plurality of housings which are connected to one another.

The above objects of the invention may be achieved by a housing constructed with intake parts formed in one side wall of the housing, and exhaust ports in the other. An intake-side passage is defined between one side wall and one end of a chassis contained in the housing. An exhaust-side passage is defined between the other side wall and the other end of the chassis. Also, a cooling fan is provided in the housing, whereby cooling air is circulated through the intake ports, intake-side passage, the chassis itself, exhaust-side passage, and exhaust ports.

If a single housing is used, the cooling air flows in a straight direction across the width of the housing and through the chassis between the respective intake and exhaust ports.

When arranging a plurality of such housings adjacent to one another, their facing side walls are removed, and their adjacent frames are connected. The exhaust-side passage of one housing and the intake-side passage of another housing adjacent thereto are combined into an integral common passage. The front and rear coupling walls can be joined so that intake ports and exhaust ports are formed. A partition wall is added within the common passage and extends at an angle to the depth direction of the housing to divide the inside of the common passage into two parts; a first passage connecting with the exhaust-side end of the chassis in the one housing and the exhaust ports in the rear coupling wall, and a second passage connecting with the intake-side end of the chassis in the other housing and the intake ports in the front coupling wall. Thus, in the first housing, the cooling air flows through the intake ports of the one side wall, the chassis, the first passage, and the exhaust ports in the rear coupling wall. In the second housing, the air flows through the intake ports of the front coupling wall, the second passage, the chassis, and the exhaust ports of the other side wall. Since the common passage is a combination of the intake- and exhaust-side passages, it has a substantial dimension in the width direction of the housings, and never restricts the flow of the cooling air in the depth direction of the housings through the first and second passages that are formed by dividing the common passage.

BRIEF DESCRIPTION OF THE DRAWINGS

The above and other objects and advantages of the present invention will be apparent in the following detailed description of illustrative embodiments thereof which is to be read in connection with the accompanying drawings, in which.

DETAILED DESCRIPTION OF THE PREFERRED EMBODIMENTS

Figure 1:
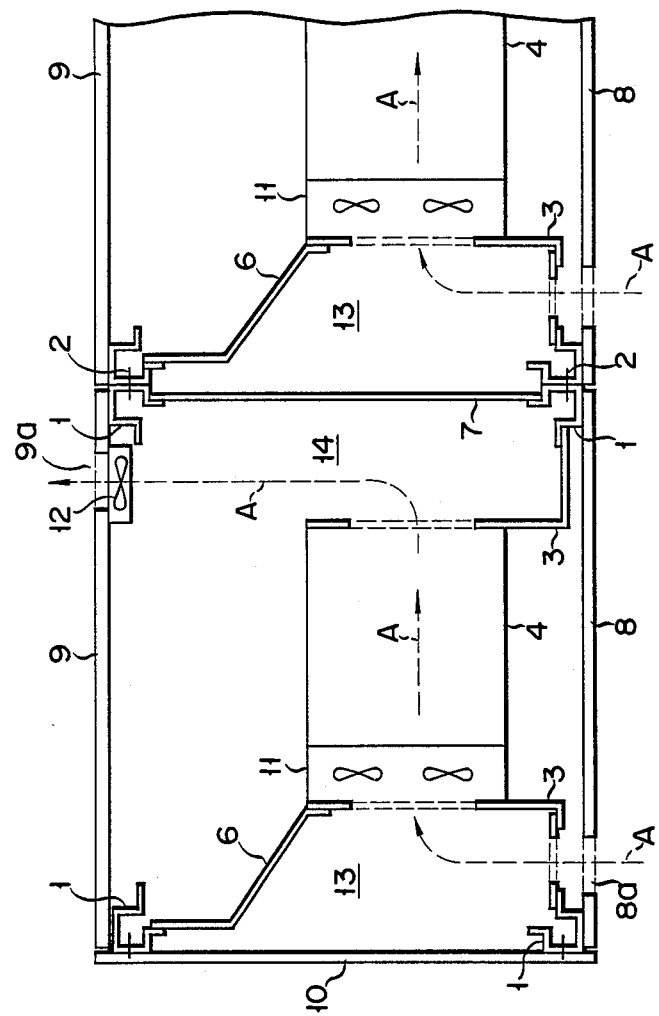
FIG. 1 is a plan view showing a housing unit including a plurality of prior art connected housings each with its upper wall removed and showing ports as broken lines.
Figure 2:
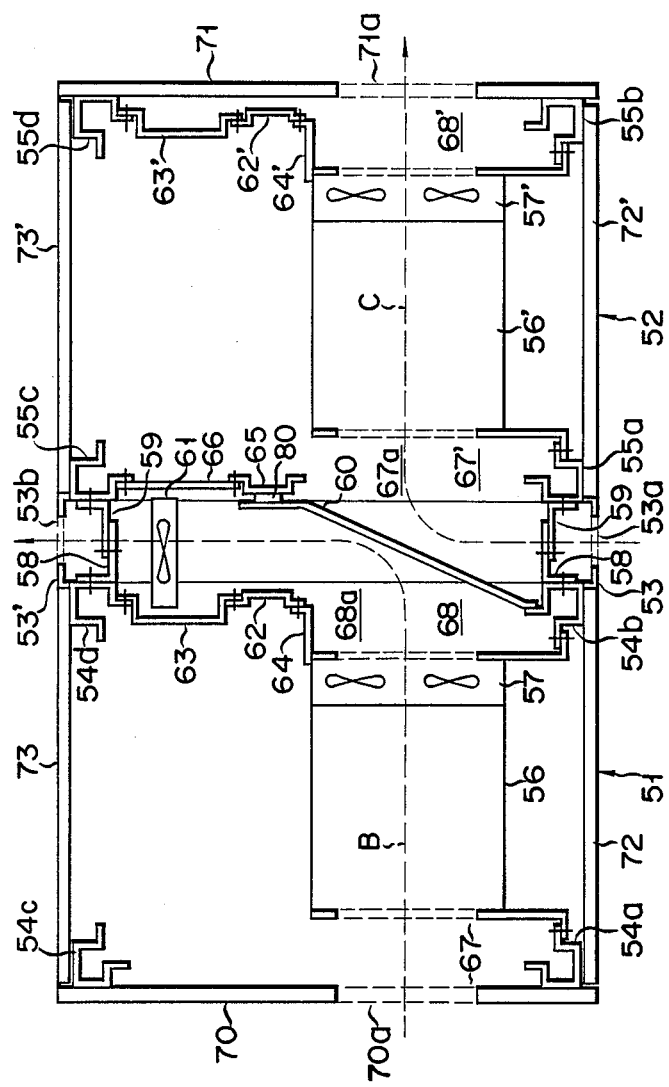
FIG. 2 is a plan view showing a housing unit including a plurality of connected housings, each with its upper wall removed and showing ports as broken lines, according to an embodiment of the invention.
Figure 3:
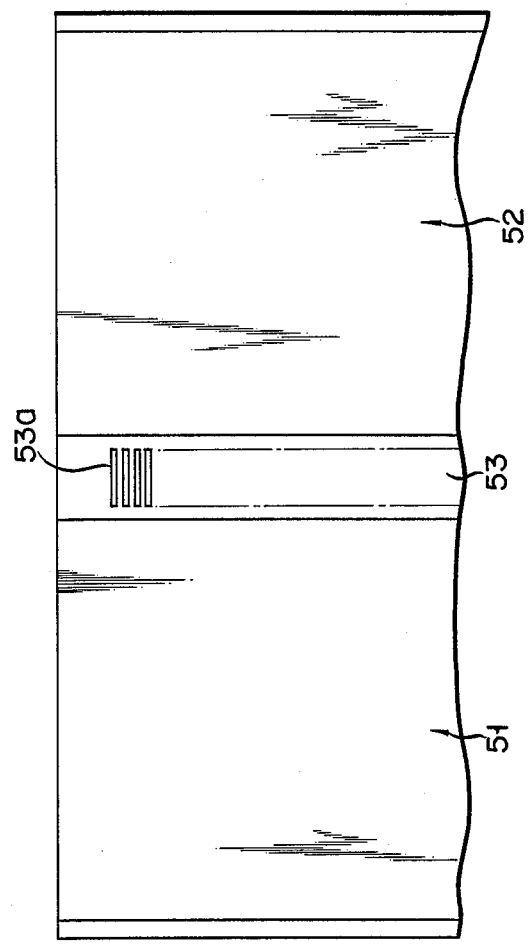
FIG. 3 is a front view showing part of the housing unit of FIG. 2.

FIG. 2 shows an assembly of housings according to an embodiment of the present invention. In the drawing, two housings 51 and 52 are coupled to each other. The combination of the housings comprises frames 54a, 54b, 54c 54d, 55a, 55b, 55c and 55d formed of shaped material, two side walls 70 and 71, front walls 72, 72', rear walls 73, 73', and top and bottom walls (not shown). Adjacent side walls of housings 51 and 52 are removed. The housing unit contains therein chassis 56 and 56' each mounted with electronic equipment. Chassis 56 and 56' are provided with cooling fan units 57 and 57', respectively, for supplying cooling air. The chassis are held in position in the unit by means of support members.

Side walls 70 and 71 are formed with intake ports 70a and exhaust ports 71a, respectively.

Subframes 62 and 62' extend vertically in the housing unit. Partition plates 63 and 63' are mounted between subframe 62 and frame 54d and between subframe 62' and frame 55d, respectively. Likewise, partition plates 64 and 64' are mounted between subframe 62 and chassis 56 and between subframe 62' and chassis 56', respectively. Each subframe 62, 62' and each pair of partition plates 63, 63' and 64, 64' constitute a partition wall. Intake-side passage 67 connects with intake ports 70a and one end (the intake-side end) of chassis 56. Exhaust-side passage 68 connects with exhaust ports 53b and the other end (the exhaust-side end) of chassis 56. Intake-side passage 67' connects with intake ports 53a and one end (the intake-side end) of chassis 56'. Exhaust-side passage 68' connects with exhaust ports 71a and the other end (the exhaust-side end) of chassis 56'.

Housings 51 and 52 are arranged side by side with their facing side walls removed as aforesaid. Frames 54b and 55a and frames 54d and 55c are connected to one another by means of L-shaped coupling members 58 and 59, as shown in FIG. 2, so that housings 51 and 52 are combined into an integral unit. The coupling members and frames are fixed by means of a conventional fastening member such as a bolt and nut assembly. Front and rear coupling walls 53, 53' are interposed between the two housings and fixed by them. Intake ports 53a and exhaust ports 53b are formed in the front and rear walls, respectively.

When the housings are coupled together, exhaust-side passage 68 of housing 51 and intake-side passage 67' of housing 52 are combined to form an integral common passage. Another partition wall 60 extends vertically in the common passage. One end of wall 60 is attached to frame 54b of housing 51, while the other end is connected to additional subframe 65 by means of seal member 80. Wall 60 divides the common passage into first and second passages 68a and 67a. First passage 68a connects with the exhaust-side end of chassis 56 and exhaust ports 53b which are formed in rear coupling wall 53'. Second passage 67a connects with the intake-side end of chassis 56' and intake ports 53a which are formed in front coupling wall 53. The vertical length of coupling members 58 and 59 is much shorter than the height of the first and second passages 68a, 67a so that air flows over the coupling members 58 and 59.

Auxiliary cooling fan 61 is provided in first passage 68a.

When setting e.g. housing 51 independently, according to this embodiment, side wall 71 having exhaust ports 71a is attached to the right-hand side face of the housing and auxiliary cooling fan 61 is removed. In this arrangement, cooling air flows through intake ports 70a, intake-side passage 67, the inside of chassis 56, exhaust-side passage 68, and exhaust ports 71a, in a straight line across the housing. Flowing in this manner, the air cools the electronic equipment in chassis 56. Even though the dimension of passages 67 and 68 across the housing, that is the spaces between side wall 70 and chassis 56, and between sidewall 71 and chassis 56 are reduced, the flow rate of the air will never be limited. Thus, passage 67 and passage 68, and hence housing 51, can be reduced in width without lowering the cooling effect.

When arranging two housings 51 and 52 adjacent to each other, on the other hand, their respective facing side walls are removed, coupling walls 53', partition wall 60, auxiliary cooling fan 61, etc., are added, and the housings are joined together, as shown in FIG. 2. In this case, the cooling air in housing 51 flows through intake ports 70a, intake-side passage 67, the inside of chassis 56, first passage 68a, and exhaust ports 53b of rear coupling wall 53', as indicated by arrow B. In housing 52, the air flows through intake ports 53a of front coupling wall 53, second passage 67a, the inside of chassis 56', exhaust-side passage 68', and exhaust ports 71a, as indicated by arrow C. First passage 68a and second passage 67a are wide enough, since they are formed by dividing the common passage which is a combination of intake-side passage 67 of housing 52 and exhaust-side passage 68' of housing 51. Therefore, first and second passages 68a, 67a never restrict the flow of the cooling air therein. Since the common passage is perfectly divided by partition wall 60, moreover, hot air flowing through first passage 68a is prevented from getting mixed with cold air flowing through second passage 67a.

Three or more housings may be connected in the same manner as aforesaid.

Figure 4:
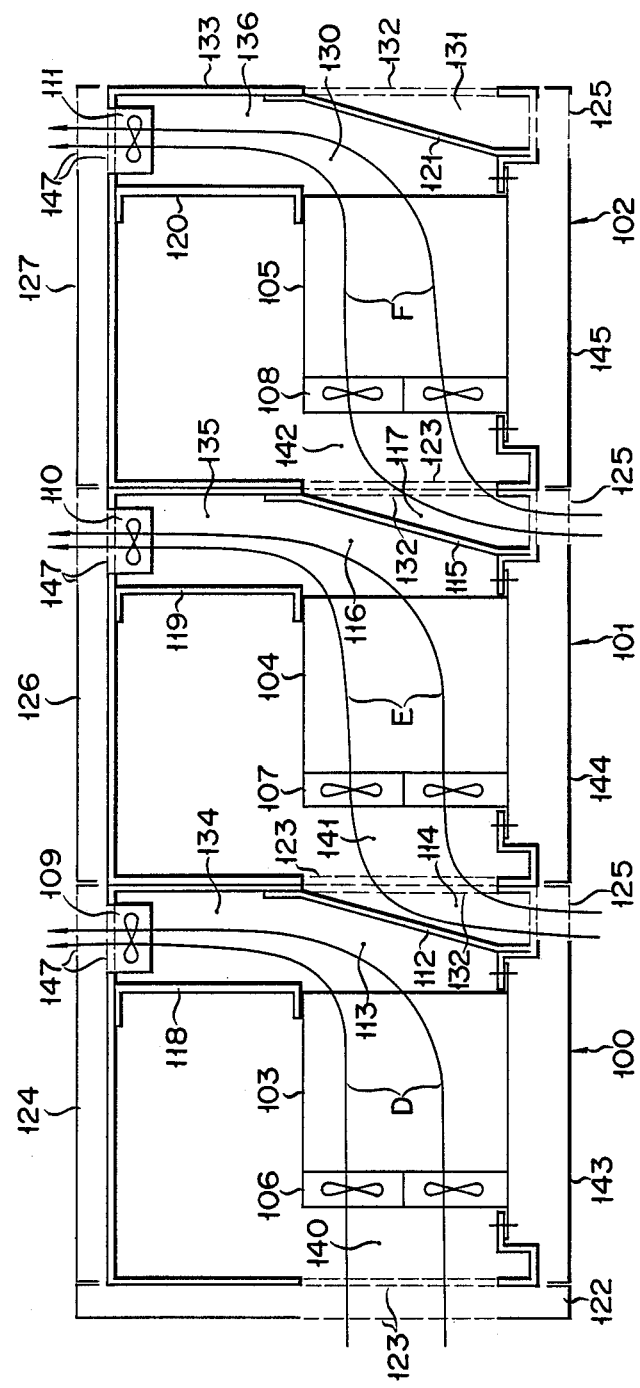
FIG. 4 is a plan view showing a housing unit including a plurality of connected housings, each with its upper wall removed and showing ports as broken lines, according to another embodiment of the invention.
Figure 5:
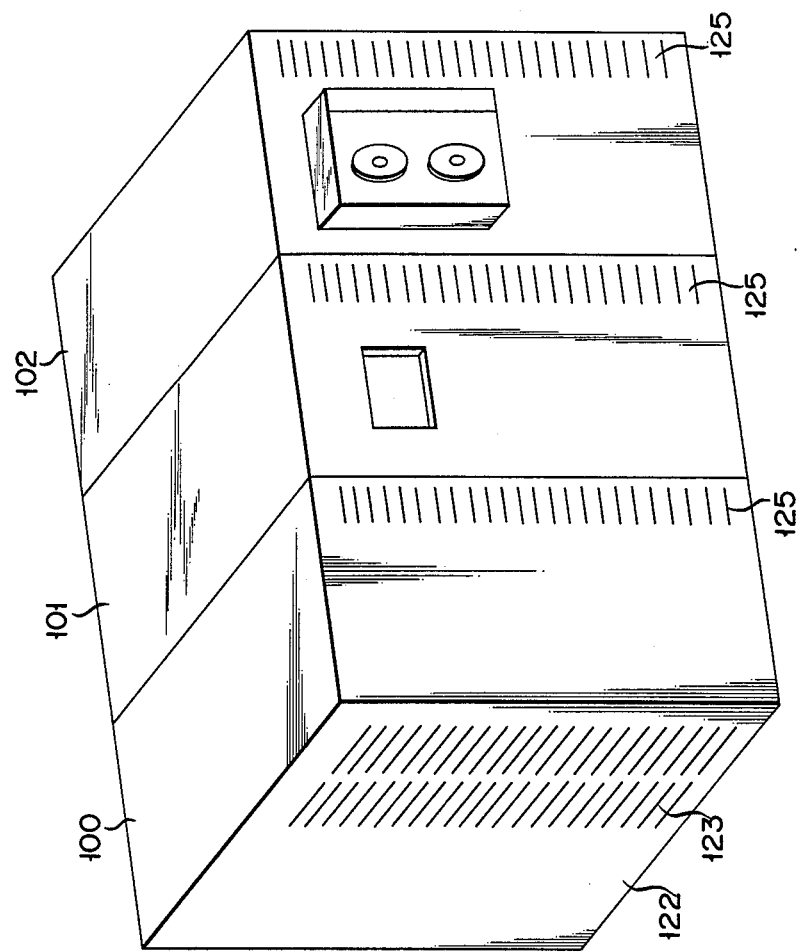
FIG. 5 is a perspective view of the housing unit of FIG. 4.

FIGS. 4 and 5 show another embodiment of the present invention. In these drawings, three housings 100, 101 and 102 are coupled to one another. The housings comprise front walls 143, 144 and 145 and rear walls 124, 126 and 127, respectively, and side walls 122 and 133 each. They contain therein chassis 103, 104 and 105, respectively, each mounted with electronic equipment. Chassis 103, 104 and 105 are provided with cooling fan units 106, 107 and 108, respectively. Side walls 122 and 133 of each housing are formed with intake ports 123 and exhaust ports 132, respectively. The individual housings are internally divided by partition plates 118, 119 and 120. Intake-side passages 140, 141 and 142 are formed on the intake side of chassis 103, 104 and 105, respectively, and exhaust-side passages 134, 135 and 136 on the exhaust side.

Intake ports 125 are formed in front walls 143, 144 and 145, and exhaust ports 147 in rear walls 124, 126 and 127. Slanted partition walls 112, 115 and 121 are mounted in exhaust-side passages 134, 135 and 136, respectively. Walls 112, 115 and 121 divide the inside of their corresponding exhaust-side passages 134, 135 and 136 into two parts or passages each. First passages 113, 116 and 130 connect with the exhaust-side ends of their corresponding chassis and exhaust ports 147 in the rear walls. Second passages 114, 117 and 131 connect with intake ports 125 in the front walls and exhaust ports 132 in the side walls. Passages 113, 116 and 130 are provided with auxiliary cooling fans 109, 110 and 111, respectively.

In this embodiment, second passages 114 and 117 and intake-side passages 141 and 142 of the adjacent housings are connected by exhaust ports 132 and intake ports 123 combined with one another so that cooling air flows to intake-side passages 141 and 142 from second passages 114 and 117 through exhaust ports 132 and intake ports 123. The cooling air flows through intake ports 125 of the front walls, passages 114 and 117, passages 141 and 142, the inside of chassis 104 and 105, first passages 116 and 130, and exhaust ports 147 of the rear walls, as indicated by arrows E and F. In housing 100 at the left-hand end, the air flows through intake ports 123 of side wall 122, intake-side passage 140, the inside of chassis 103, first passage 113, and exhaust ports 147 of rear wall 124, as indicated by arrow D. If the housings 101, 102 are set independently, the air in these housing flows in the same manner as in housing 100.

According to this embodiment, the cooling air in intake-side passages 140, 141 and 142 always flows in the transverse direction of the housings, whether the housings are used independently or whether they are connected to one another. Therefore, the intake-side passages, and hence the housings, can be reduced in width. In the second embodiment, moreover, the housings can be coupled without additionally using any coupling walls or partition walls which are required in the first embodiment.

It is to be understood that the present invention is not limited to the embodiments described above, and that various changes and modifications may be effected therein by one skilled in the art without departing from the scope or spirit of the invention.

What is claimed is:

1. An assembly for housing electrical equipment, the assembly comprising:
    a front coupling wall (53) having an intake port (53a);
    a rear coupling wall (53') having an exhaust port (53b);
    a partition wall (60);
    first and second chassis (56, 56') each having electrical equipment mounted thereon;
    first and second housings (51, 52) respectively housing the first and second chassis (56, 56'), each of said housings having an intake side and an exhaust side and including a front wall (72, 72'), a rear wall (73, 73'), a first side wall (70) on the intake side of the housing, and a second side wall (71) on the exhaust side of the housing, said first side wall having an intake port (70a) and said second side wall having an exhaust port (71a), said first side wall and one side of the respective chassis defining an intake-side passage (67, 67'), and said second side wall and another side of the respective chassis opposite the one side defining an exhaust-side passage (68, 68'), the second side wall of said first housing (51) being removably connected to the front and rear walls, and the first side wall of said second housing (52) being removably connected to the front and rear walls; and
    blowing means for flowing air from the intake port (70a) to the exhaust port (71a) of each of said housings (51, 52) through the intake-side passage (67, 67'), the respective chassis (56, 56'), and the exhaust-side passage (68, 68');
    the second side wall (71) of said first housing (51) and the first side wall (70) of said second housing (52) being removed, the front walls (72, 72') of said first and second housings being connected by said front coupling wall (53) located therebetween, and the rear walls (73, 73') of said first and second housings being connected by said rear coupling wall (53') located therebetween so that a common passage is formed by the exhaust-side passage (68) of said first housing (51), the intake-side passage (67') of said second housing (52) and a space between the front and rear coupling walls (53, 53') to communicate the exhaust-side passage (68) and the intake-side passage (67'); and
    said partition wall (60) being mounted in the common passage to divide the common passage into a first passage (68a) located on the exhaust side of said first housing (51) and communicating with the intake-side passage (67) of said first housing (51), and a second passage (67a) located on the intake side of said second housing (52) and communicating with the exhaust-side passage (68') of said second housing (52), said partition wall (60) having a slanted portion located between the first and second chassis (56, 56') housed in said first and second housings and extending from the front side of said first housing (51) to the rear side of said second housing (52);
    whereby when said first and second housings are connected, air introduced from the intake port (70a) of said first housing (52) flows to the exhaust port (53b) of said rear coupling wall (53') through the intake-side passage (67) of said first housing (51), the first chassis (56), and the first passage (68a), and air introduced from the intake port (53a) of said front coupling wall (53) flows to the exhaust port (71a) of said second side wall (71) through the intake side passage (67') of said second housing (52), the second chassis (56'), and the exhaust side passage (68') of said second housing (52).

2. The assembly according to claim 2 wherein said blowing means includes a fan unit (57, 57') attached to the respective chassis (56, 56') in each of said first and second housings (51, 52) to cause air to flow to the exhaust-side passage (68, 68') from the intake-side passage (67, 67') of each respective housing.

3. The assembly according to claim 2, further comprising a second fan unit (61) disposed in the first passage (68a) to cause air to flow to the exhaust port (53b) of said rear coupling wall (53') from the exhaust-side passage (68) of said first housing (51).

4. The assembly according to claim 2, wherein, in each of said first and second housings, the intake port (70a) of the first side wall (70), the respective chassis (56, 56'), and the exhaust port (71a) of the second side wall (71) are arranged in a linear line.

5. An assembly for housing electrical equipment, the assembly comprising:
    a. first and second chassis (103, 104) each having electrical equipment mounted thereon; and
    b. first and second housings (100, 101) respectively housing the first and second chassis (103, 104), each of said housings including:
    a first side wall (122) having a first intake port (123);
    a second side wall (133) having a first exhaust port (132);
    a rear wall (124, 126) having a second exhaust port (147);
    said first side wall (122) and one side of the respective chassis (103, 104) defining an intake-side passage (140, 141), and said second side wall (133) and the opposite side of the respective chassis (103, 104)

defining an exhaust-side passage (134, 135), said first exhaust port (132), said second exhaust port (147), and said second intake port (125) being provided in the exhaust-side passage (134, 135);

blowing means; and a partition wall (112, 115) provided in the exhaust-side passage (134, 135) to divide the exhaust side passage into a first passage (113, 116) through which air introduced from the first intake port (123) flows to the second exhaust port (147) via the intake-side passage (140, 141) and the respective chassis (103, 104), and a second passage (114, 117) in which the first exhaust port (132) and second intake port (125) are provided;

whereby when said first and second housings are connected such that the second side wall (133) of said first housing (100) faces the first side wall (122) of said second housing (101), the second passage (114) of said first housing (100) is communicating with the intake-side passage (141) of said second housing (101) through the first exhaust port (132) of said first housing (100) and first intake port (123) of said second housing (101), the blowing means of said second housing (101) causing air introduced from the second intake port (125) of said first housing (100) to flow to the second exhaust port (147) of said second housing (101) through the second passage (114) and first exhaust port (132) of said first housing (100), and through the first intake port (123), the intake-side passage (141), second chassis (104), and the exhaust-side passage (135) of said second housing (101); and said partition wall (112, 115) of each of said housings (100, 101) having a slanted portion located between the respective chassis (103, 104) in said respective housing and said second side wall (133), said slanted portion having one end spaced from said second side wall (133) at the front side of said respective housing and another end extending toward said second side wall (133).

6. The assembly according to claim 5 wherein said partition wall (112, 115) in each housing extends to the second side wall (133) from the front wall (100, 101).

7. The assembly according to claim 6 wherein said blowing means includes a fan unit (106, 107) mounted on each of said chassis (103, 104).

8. The assembly according to claim 7 wherein said blowing means further includes a second fan unit (109, 110) provided in the first passage (113, 116) of each of said housings (100, 101).

9. An assembly for housing electrical equipment, comprising:

a chassis (103);

a housing (100) including a first side wall (122) having a first intake port (123), a second side wall (133) having a first exhaust port (132), a front wall (143) having a second intake port (125), and a rear wall (124) having a second exhaust port (147), said first and second side walls, said front wall, and said rear wall defining an enclosure housing the chassis, said first side wall and one side of the chassis defining an intake-side passage (140) and said second side wall and the other side of the chassis opposite the one side defining an exhaust-side passage (134), said first exhaust port (132), said second exhaust port (147) and second intake port (125) being provided in the exhaust-side passage (134);

a partition wall (112) provided in the exhaust-side passage (134) to divide the exhaust-side passage into a first passage (113) through which air introduced from the first intake port (123) flows to the second exhaust port (147) via the intake-side passage (140) and the chassis (103), and a second passage (114) in which the first exhaust port (132) and second intake port (125) are provided; and blowing means provided in the housing for flowing air introduced from the first intake port (123) to the second exhaust port (147) through the intake-side passage (140), the chassis (103), and the first passage (113).

* * * * *